(12) United States Patent
Kujirai

(10) Patent No.: US 7,867,856 B2
(45) Date of Patent: Jan. 11, 2011

(54) METHOD OF MANUFACTURING A SEMICONDUCTOR DEVICE HAVING FIN-FIELD EFFECT TRANSISTOR

(75) Inventor: Hiroshi Kujirai, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 12/822,862

(22) Filed: Jun. 24, 2010

(65) Prior Publication Data

US 2010/0261328 A1    Oct. 14, 2010

Related U.S. Application Data

(62) Division of application No. 11/822,591, filed on Jul. 9, 2007, now abandoned.

(30) Foreign Application Priority Data

Jul. 26, 2006    (JP) .............................. 2006-202937

(51) Int. Cl.
*H01L 21/336* (2006.01)
*H01L 21/76* (2006.01)

(52) U.S. Cl. ....................... 438/270; 438/296; 438/268; 438/427

(58) Field of Classification Search ................. 438/270, 438/283, 427, 157, 753, 164, 151, 154, 752, 438/279, 296, 268, 206, 221, 271, 399
See application file for complete search history.

(56) References Cited

U.S. PATENT DOCUMENTS

| | | | |
|---|---|---|---|
| 6,222,225 B1 * | 4/2001 | Nakamura et al. .......... 257/315 |
| 6,764,884 B1 | 7/2004 | Yu et al. |
| 6,800,910 B2 | 10/2004 | Lin et al. |
| 6,967,175 B1 | 11/2005 | Ahmed et al. |
| 7,129,550 B2 | 10/2006 | Fujiwara et al. |
| 7,323,375 B2 | 1/2008 | Yoon et al. |
| 7,453,124 B2 | 11/2008 | Adan |
| 2002/0011612 A1 | 1/2002 | Hieda |
| 2005/0051825 A1 | 3/2005 | Fujiwara et al. |
| 2005/0136617 A1 * | 6/2005 | Jang .......................... 438/427 |

(Continued)

FOREIGN PATENT DOCUMENTS

JP          57-010973          1/1982

(Continued)

OTHER PUBLICATIONS

Kedzierski et al., High-Performance Symmetric-Gate and CMOS-Compatible V, Asymmetric-Gate FinFET Devices, Tech. Dig. IEDM, 2001, pp. 437-440.

*Primary Examiner*—Chuong A. Luu
(74) *Attorney, Agent, or Firm*—Foley & Lardner LLP

(57) ABSTRACT

A semiconductor device includes an element isolation region formed in a semiconductor substrate, an active region surrounded by the element isolation region, and a gate electrode formed in one direction to cross the active region. The semiconductor substrate includes two gate trenches formed in parallel to a major axis direction of the active region in the active region, and a fin-shaped part which is located between the two gate trenches. The gate electrode is buried in the two gate trenches and formed on the fin-shaped part. The fin-shaped part serves as a channel region. A fin field effect transistor in which a width of the channel region is smaller than a gate length is thereby obtained.

10 Claims, 15 Drawing Sheets

U.S. PATENT DOCUMENTS

| | | |
|---|---|---|
| 2005/0186742 A1 | 8/2005 | Oh et al. |
| 2005/0224800 A1* | 10/2005 | Lindert et al. .................. 257/66 |
| 2005/0272195 A1* | 12/2005 | Bryant et al. ............... 438/212 |
| 2005/0285186 A1* | 12/2005 | Fujiwara ..................... 257/327 |
| 2006/0054969 A1* | 3/2006 | Jang et al. .................... 257/327 |

FOREIGN PATENT DOCUMENTS

| | | |
|---|---|---|
| JP | 08-181323 | 7/1996 |
| JP | 2003-101013 A | 4/2003 |
| JP | 2005-086024 A | 3/2005 |
| JP | 2005-310921 | 11/2005 |
| JP | 2006-12924 A | 1/2006 |
| JP | 2006-501672 A | 1/2006 |
| WO | WO 2004/084292 A1 | 9/2004 |

* cited by examiner

METHOD OF MANUFACTURING A SEMICONDUCTOR DEVICE HAVING FIN-FIELD EFFECT TRANSISTOR

CROSS-REFERENCE TO RELATED PATENT APPLICATIONS

This application is a division of application Ser. No. 11/822,591, filed Jul. 9, 2007, abandonment, and based on Japanese Patent Application No. 2006-202937, filed Jul. 26, 2006, by Hiroshi Kujirai, which is incorporated herein by reference in its entirety. This application claims only subject matter disclosed in the parent application and therefore presents no new matter.

TECHNICAL FIELD

The present invention relates to a semiconductor device and a manufacturing method thereof, and particularly relates to a semiconductor device including a fin field effect transistor and a method of manufacturing the semiconductor method.

BACKGROUND OF THE INVENTION

In recent years, following downsizing of a memory cell in a DRAM (Dynamic Random Access Memory), a gate length of a memory cell transistor is inevitably reduced. However, if the gate length is smaller, then the short channel effect of the transistor disadvantageously becomes more conspicuous, and sub-threshold current is disadvantageously increased. Furthermore, if substrate concentration is increased to suppress the short channel effect and the increase of the sub-threshold current, junction leakage increases. Due to this, the DRAM is confronted with a serious problem of deterioration in refresh characteristics.

As a technique for avoiding the above-stated problem, attention has been paid to a fin field effect transistor (fin-FET) structured so that channel regions are formed to be thin each in the form of a fin in a perpendicular direction to a semiconductor substrate and so that gate electrodes are arranged around each of the channel regions, as disclosed in Japanese Patent Application National Publication No. 2006-501672 and Japanese Patent Application Laid-Open No. 2005-310921. The fin-FET is expected to be able to realize acceleration of operating rate, increase in ON-current, reduction in power consumption and the like, as compared with a planer transistor.

However, to suppress the short channel effect, it is necessary to make a channel width smaller than a gate length in the fin-FET.

FIG. 14A is a generally plan view of a conventional fin-FET. FIG. 14B is a generally plan view of a fin-FET according to a related art. FIG. 14A shows an active region 200a, gate regions 201a, and contact regions 202a in a standard fin-FET. FIG. 14B shows thinned contact regions, i.e., an active region 200b, gate regions 201b, and contact regions 202b. In FIG. 14B, the active region 200a shown in FIG. 14A is shown around the active region 200b by a broken line for comparison with FIG. 14A.

In FIG. 14A, the ON-current can be increased because the contact regions 202a can be secured to be sufficiently large. However, the short channel effect cannot be suppressed sufficiently because a channel width Wa is large, i.e., larger than a gate length Lga.

To solve the problem of the conventional fin-FET shown in FIG. 14A, there is proposed a method of narrowing a channel width Wb by forming the thinned active region 200b as shown in FIG. 14B. By doing so, a gate length Lgb is larger than the channel width Wb, so that the short channel effect can be suppressed. However, the fin-FET shown in FIG. 14B has the following problems. Not only the channel width Wb but also a width of each contact region 202b is narrowed. As a result, a contact resistance is increased and ON-current is reduced accordingly.

SUMMARY OF THE INVENTION

Therefore, it is an object of the present invention to provide a semiconductor device and a semiconductor device manufacturing method capable of suppressing the short channel effect and increasing ON-current.

According to the present invention, there is provided a semiconductor device comprising a fin-shaped channel region and a gate electrode, wherein the channel region located under the gate electrode has a width smaller than a gate length.

According to the present invention, there is provided a semiconductor device comprising an element isolation region formed in a semiconductor substrate; an active region surrounded by the element isolation region and elongated to a first direction; a gate electrode formed in a second direction crossing the first direction; two gate trenches formed in the semiconductor substrate located at a cross region of the active region and the gate electrode, the two gate trenches being elongated to the first direction in parallel; and a fin-shaped part that is a part of the semiconductor substrate and located between the two gate trenches, wherein the gate electrode is buried in the gate trenches and formed on the fin-shaped part, thereby the fin-shaped part serves as a channel region.

Moreover, the method of manufacturing the semiconductor device according to the present invention includes:

forming a mask layer on a semiconductor substrate, the mask layer covering up a region to serve as an active region and including an opening for exposing a region to serve as an STI region;

forming a trench for the STI region using the mask layer;

forming a first insulating film in the trench and in the opening of the mask layer without removing the mask layer;

forming a second opening corresponding to the mask layer in the first insulating film by selectively removing the mask layer;

forming a sidewall insulating film on an inner wall of the second opening;

forming a second insulating film in the second opening in which the sidewall insulating film is formed;

selectively removing the sidewall insulating film in a region in which a gate electrode is to be formed;

forming two trenches in the region in which the gate electrode is to be formed on the semiconductor substrate using the first insulating film and the second insulating film as a mask, and forming a fin-shaped part which is located between the two gate trenches, which is a part of the semiconductor substrate, and which is to serve as a channel region;

forming a gate insulating film at least on an upper surface and a side surface of the fin-shaped part; and forming the gate electrode buried in the two gate trenches and covering up the fin-shaped part. With such a method, the width of the channel region under the gate electrode can be made smaller than the gate length.

As described above, the present invention can realize both suppression of the short channel effect and the increase of the ON-current for the fin field effect transistor by making the width of the channel region under the gate electrode smaller than the gate length.

BRIEF DESCRIPTION OF THE DRAWINGS

The above and other objects, features and advantages of this invention will become more apparent by reference to the following detailed description of the invention taken in conjunction with the accompanying drawings, wherein.

DETAILED DESCRIPTION OF THE EMBODIMENTS

Preferred embodiments of the present invention will be explained below with reference to the accompanying drawings.

Note that the following embodiment is an example of applying the present invention to a memory cell transistor in a DRAM.

A configuration of the memory cell transistor in the DRAM formed according to the embodiment of the present invention will first be described in detail.

Figure 1A:
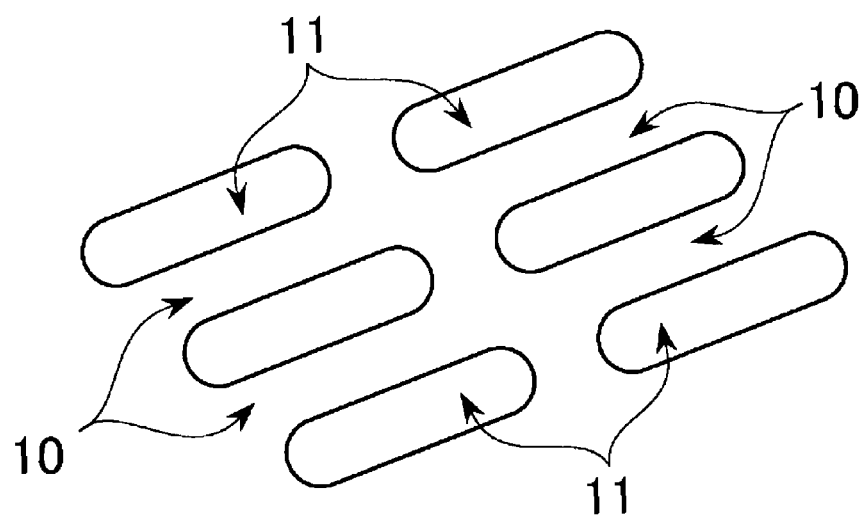
FIGS. 1A and 1B are plan views for explaining a semiconductor device according to an embodiment of the present invention.

FIG. 1A is a plan view showing an STI region (an element isolation region) 10 and a plurality of active regions 11 separated from one another by the STI region 10 in a memory cell region according to the embodiment. Generally, a plurality of active regions are arranged almost equally in the memory cell region. The same is true for the embodiment as shown in FIG. 1A.

Figure 1B:
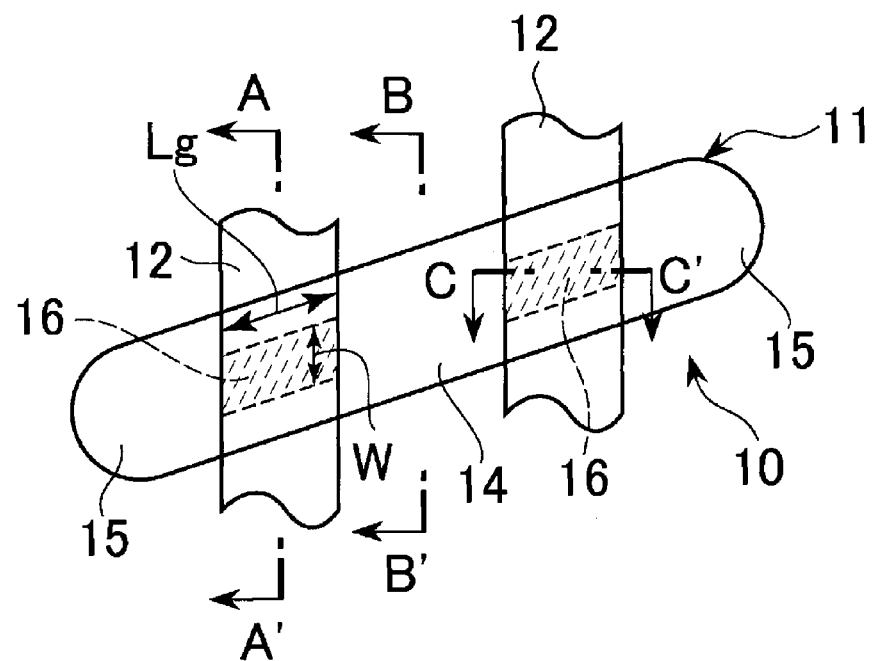

FIG. 1B is a plan view showing one of the active regions 11 shown in FIG. 1A and the STI region 11 around the active region 11. Gate trenches 12 are formed in one direction to cross the active region 11. A source region 14 and drain regions 15 (each of which is also referred to as "contact region") are formed in both ends of the active region 11 and between the two gate electrodes 12. In the embodiment, because the present invention is applied to the memory cell transistor in the DRAM, the source region and the drain region are often reversed depending on whether a read-in operation or a read-out operation is performed. In the embodiment, it is assumed that a central region is the source region 14, regions on both sides of the central region are the drain regions 15, and that the memory cell transistor is an N-channel transistor.

As shown in FIG. 1B, a channel region 16 having a width W smaller than a gate length Lg is formed under each of the gate electrodes 12.

By making the width W of the channel region 16 smaller than the gate length Lg, it is possible to suppress the short channel effect, to secure sufficiently large magnitudes for the contact regions 14 and 15, and to prevent reduction in ON-current.

A method of manufacturing a semiconductor device according to the embodiment of the present invention will next be described in detail with reference to FIGS. 2 to 13. FIGS. 2 to 6 and 8 to 13 are step views schematically showing steps of manufacturing the semiconductor device according to the embodiment. In each of FIGS. 2 to 6 and 8 to 13, three cross sectional views from the left correspond to a section A-A', a section B-B', and a section C-C' taken along a line A-A', a line B-B', and a line C-C' of FIG. 1B, respectively.

Figure 2:
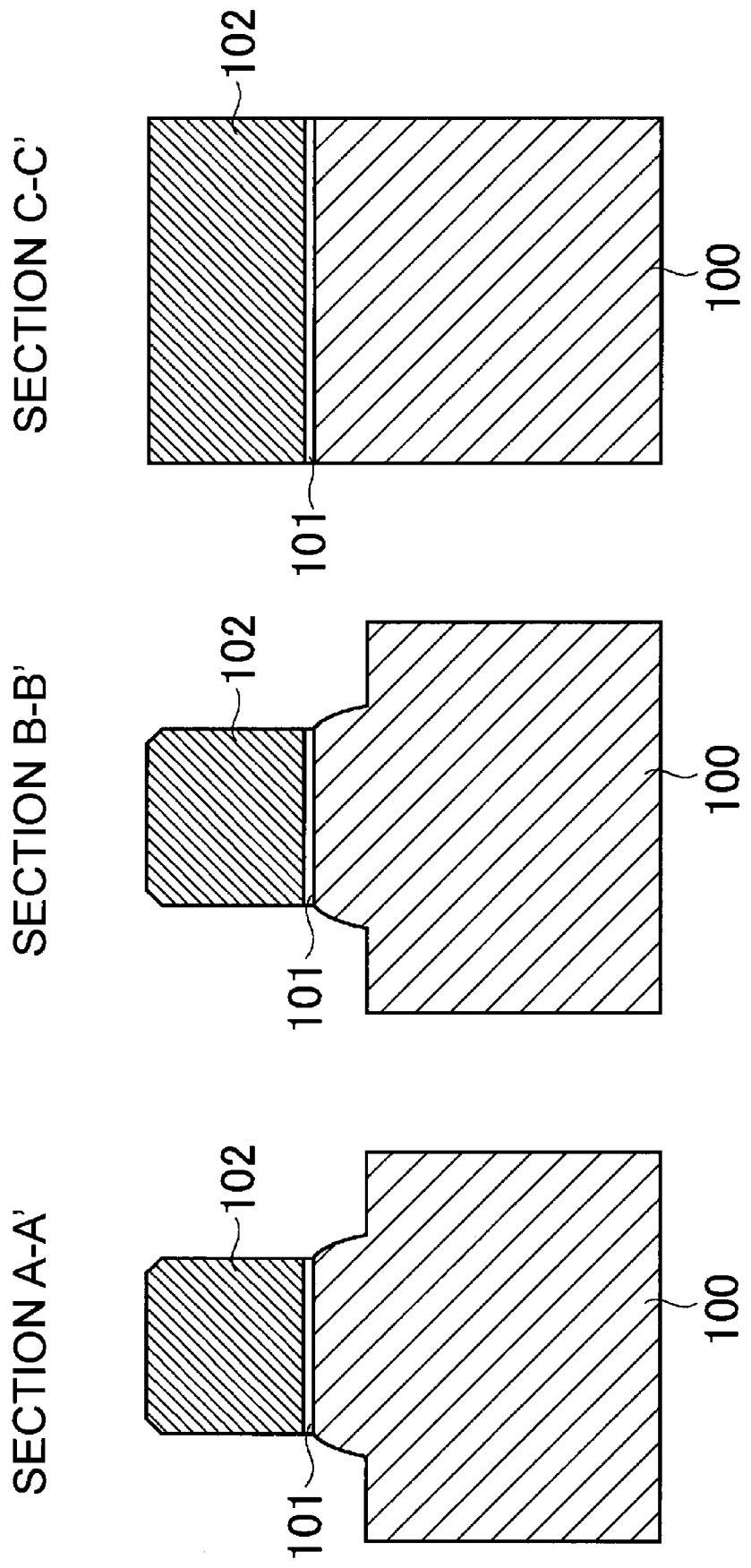
FIG. 2 is a cross-sectional view showing one process (patterning of a pad oxide film 101 and a silicon nitride film 102) in the method of manufacturing the semiconductor device according to the embodiment of the present invention.

As shown in FIG. 2, a pad oxide film 101 having a thickness of about 9 nm and a silicon nitride film 102 having a thickness of about 120 nm are formed on the semiconductor substrate 100. The pad oxide film 101 and the silicon nitride film 102 are dry-etched and patterned into shape corresponding to the active region 11 shown in FIGS. 1A and 1B by well-known photolithography. As a result, the silicon oxide film 101 and the silicon nitride film 102 serve as a mask layer covering up a region to serve as the active region 11 and including opening for exposing an STI formation region. At this time, because over-etching is performed, a surface of the semiconductor substrate 100 is slightly etched as shown in the section A-A' and the section B-B'.

Figure 3:
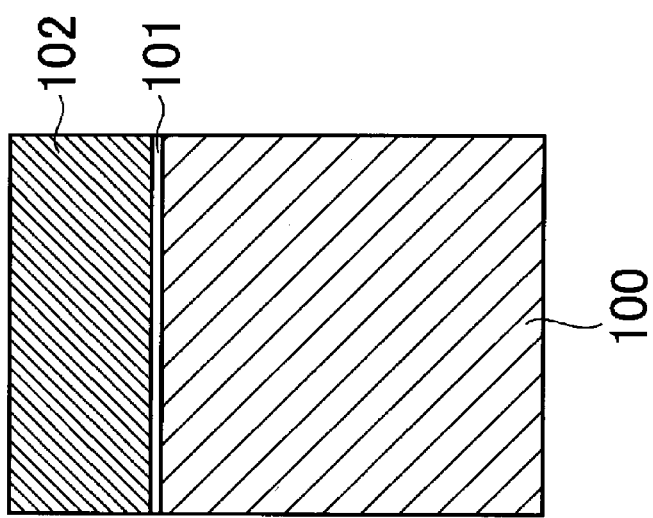
FIG. 3 is a cross-sectional view showing one process (formation of trenches 10t for STI) in the method of manufacturing the semiconductor device according to the embodiment of the present invention.
Figure 3:
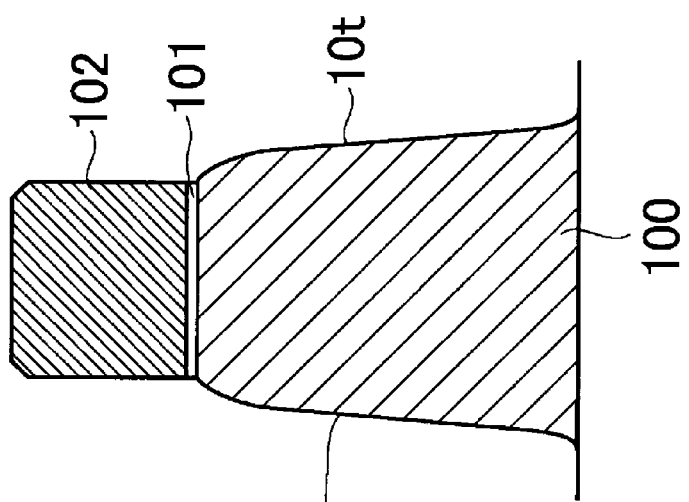
Figure 3:
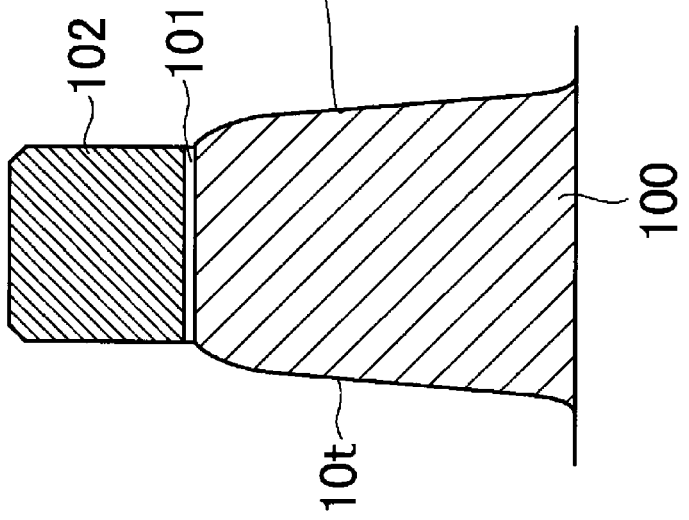

As shown in FIG. 3, while using the silicon nitride film 102 as a mask, an STI trench 10t having a depth of about 250 nm are formed in the semiconductor substrate 13. At this time, an upper surface of the silicon nitride film 102 is chipped by about 50 nm.

Figure 4:
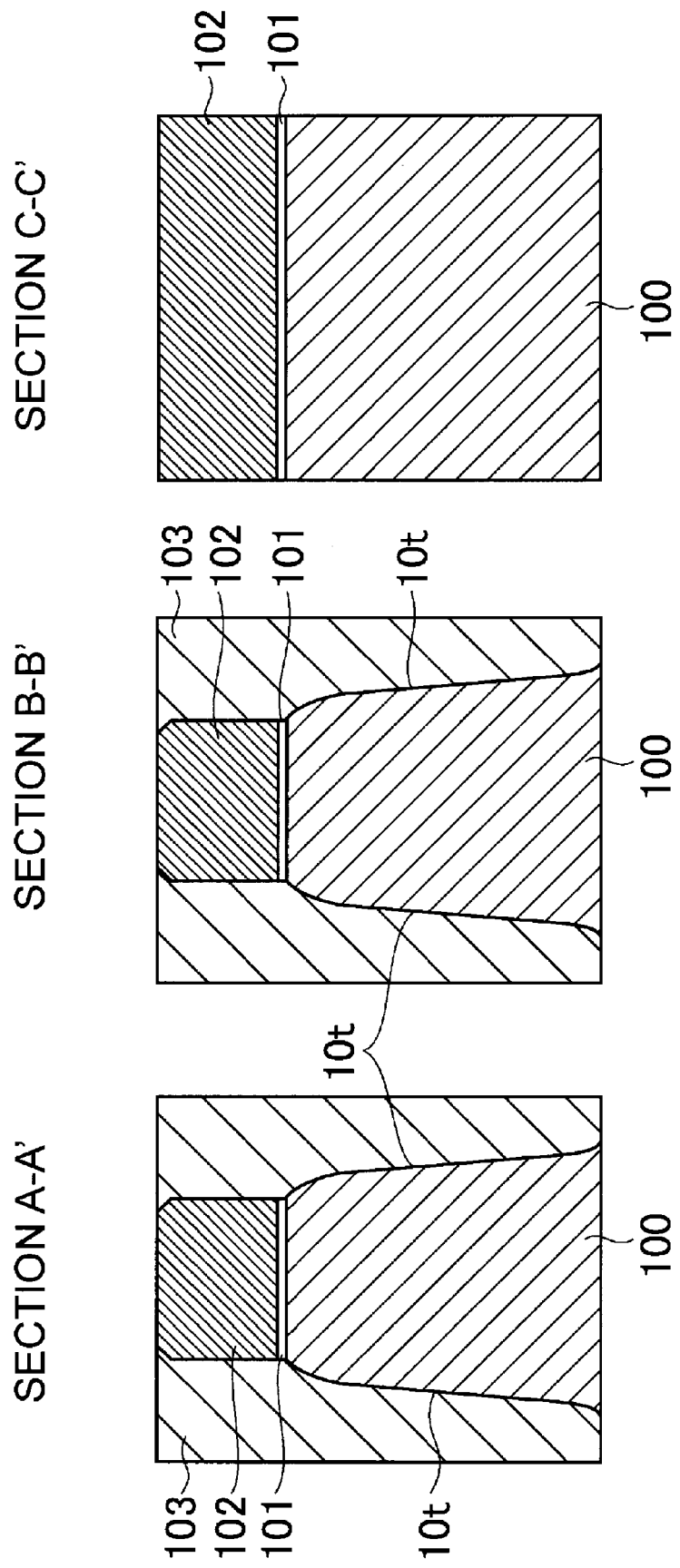
FIG. 4 is a cross-sectional view showing one process (formation of a silicon oxide film 103) in the method of manufacturing the semiconductor device according to the embodiment of the present invention.

As shown in FIG. 4, a silicon oxide film 103 having a thickness of about 400 nm is formed on an entire surface including interior of the trench 10t by HDP-CVD (High Density Plasma-Chemical Vapor Deposition). Thereafter, the silicon oxide film 103 is polished and removed by CMP (Chemical Mechanical Polishing) while using the silicon nitride film 102 as a stopper.

Figure 5:
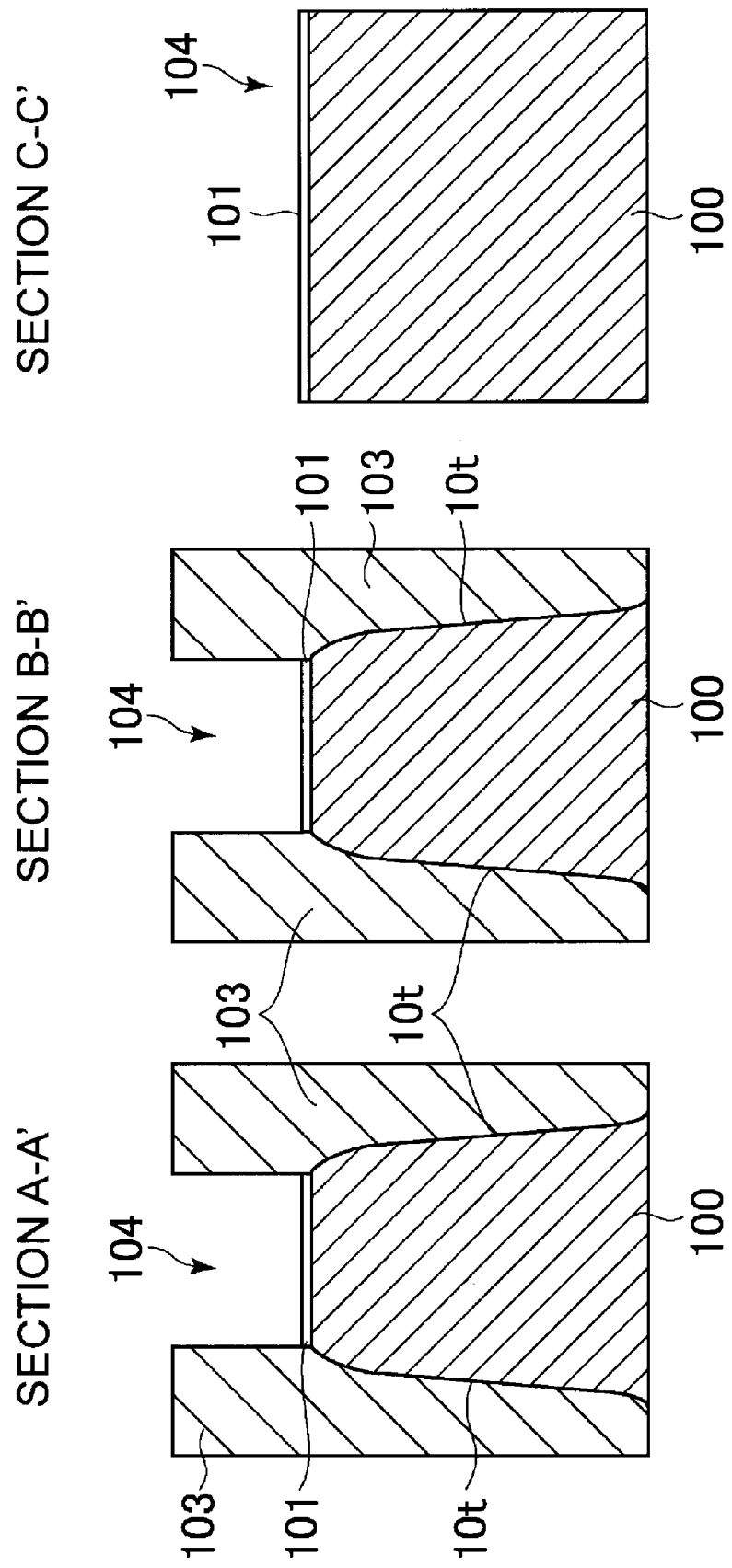
FIG. 5 is a cross-sectional view showing one process (formation of an opening 104) in the method of manufacturing the semiconductor device according to the embodiment of the present invention.

After the CMP, a native oxide film is removed by wet etching. Next, as shown in FIG. 5, the silicon nitride film 102 is removed by wet etching using a hot phosphoric acid at about 160° C. As a result, an opening 104 corresponding to the active region 11 is formed on the pad oxide film 101. At this time, a height from the surface of the semiconductor substrate 100 to a surface of the silicon oxide film 103 is preferably equal to or smaller than 70 nm.

Figure 6:
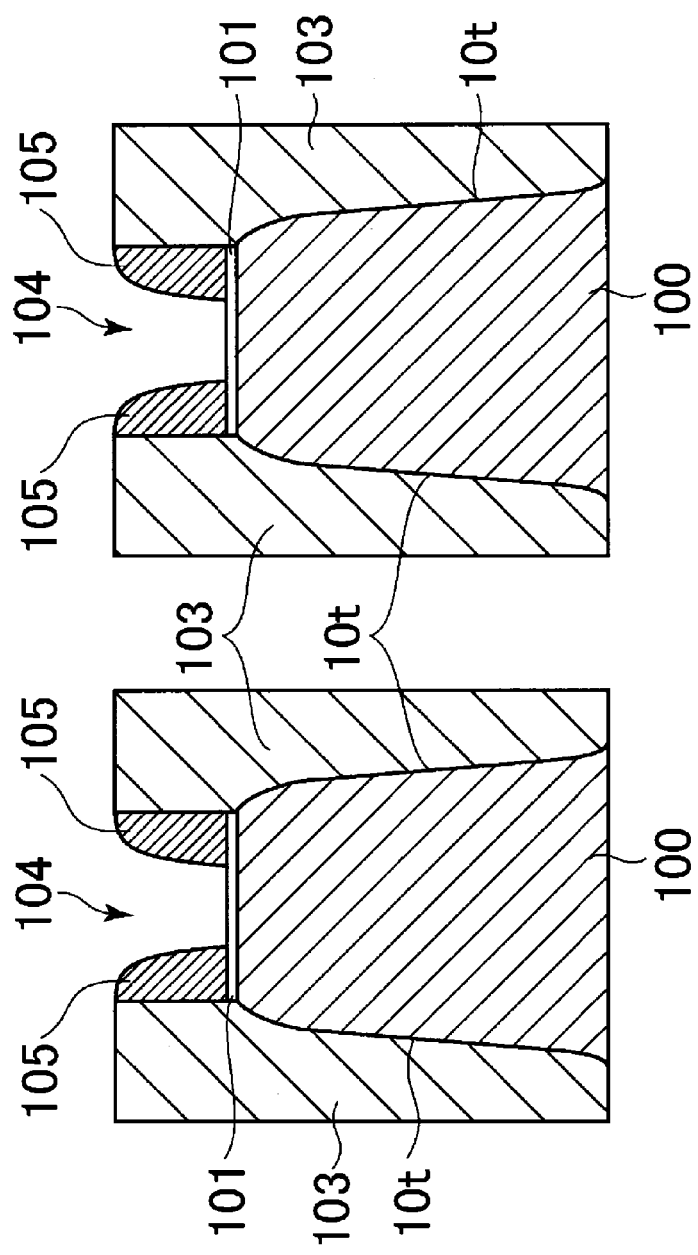
FIG. 6 is a cross-sectional view showing one process (formation of a silicon nitride film sidewall 105) in the method of manufacturing the semiconductor device according to the embodiment of the present invention.

As shown in FIG. 6, after a silicon nitride film 105 having a thickness of about 20 nm to 35 nm is formed on the entire surface, etch-back is performed, thereby forming a silicon nitride film sidewall 105 on an inner side surface of the opening 104.

Figure 7:
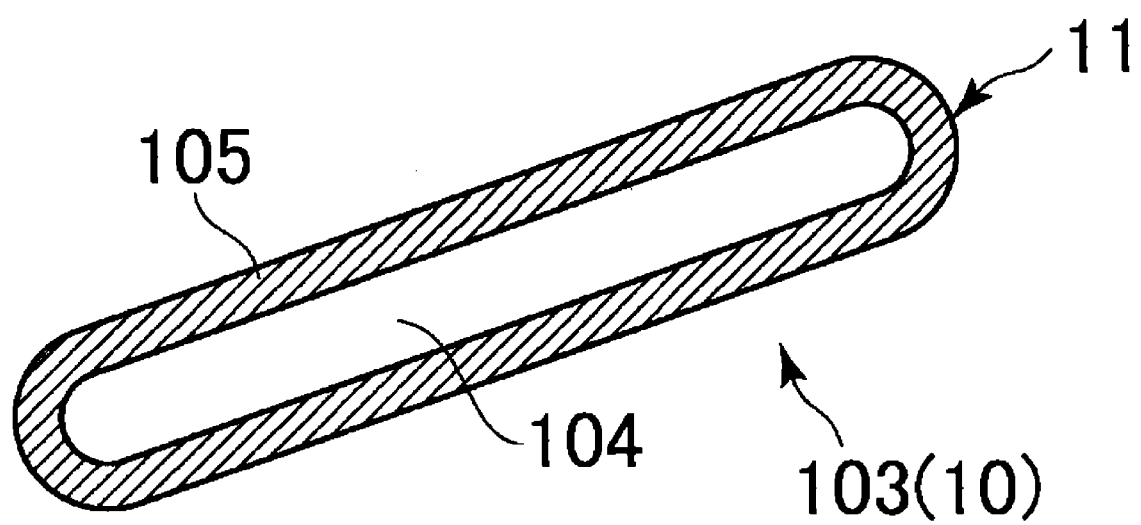
FIG. 7 is a plan view showing a state of FIG. 6 in the method of manufacturing a semiconductor device according to the embodiment from above.

FIG. 7 is a plan view showing a state of FIG. 6 from above. As shown in FIG. 7, the silicon nitride film sidewall 105 is formed along an inner periphery of the active region 11 and an interior of the silicon nitride film sidewall 105 corresponds to the opening 104.

Figure 8:
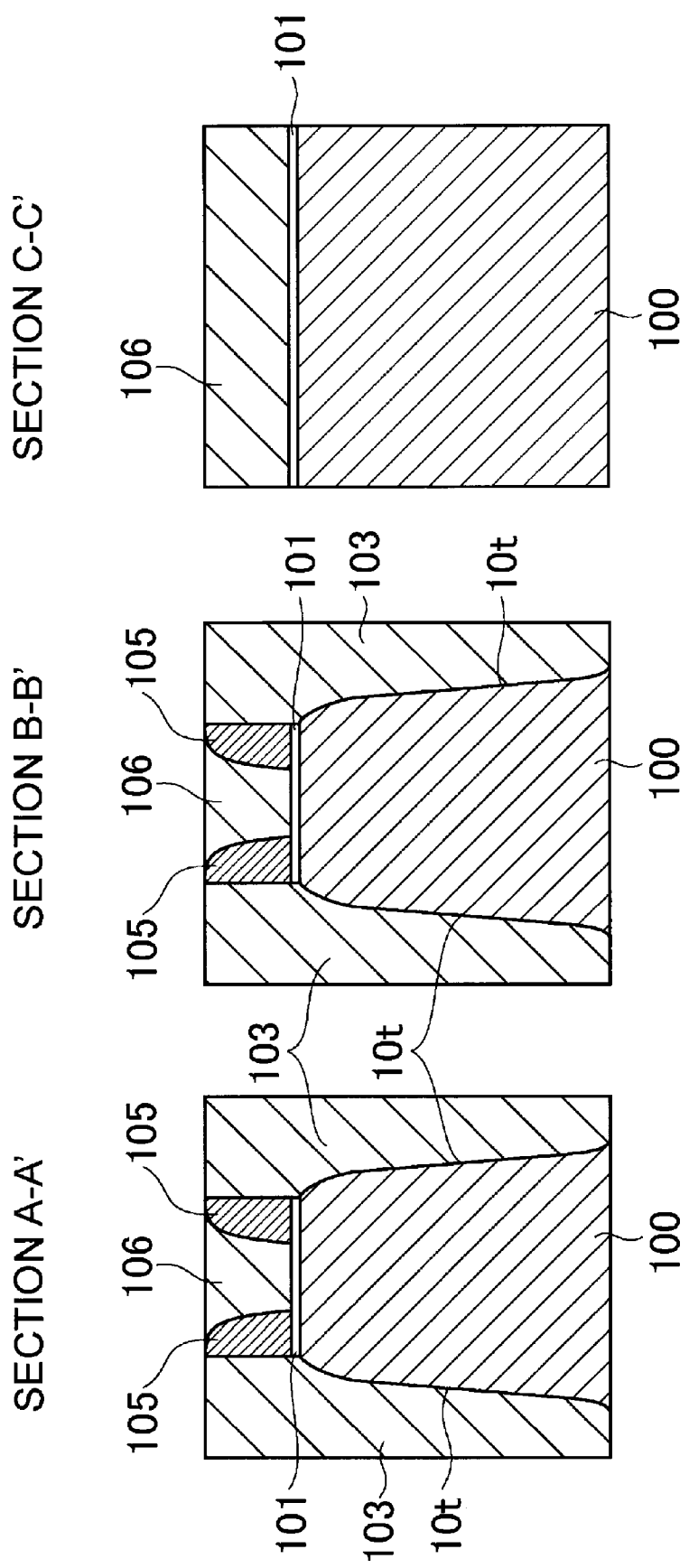
FIG. 8 is a cross-sectional view showing one process (formation of a silicon oxide film 106) in the method of manufacturing the semiconductor device according to the embodiment of the present invention.

Next, as shown in FIG. 8, after a silicon oxide film 106 having a thickness of about 100 nm is formed on the entire surface including the opening 104 surrounded by the silicon nitride film sidewall 105 (see FIG. 6), the CMP is performed using the silicon nitride film side wall 105 as a stopper. By doing so, a silicon oxide film 106 is buried in the opening 104.

Figure 9:
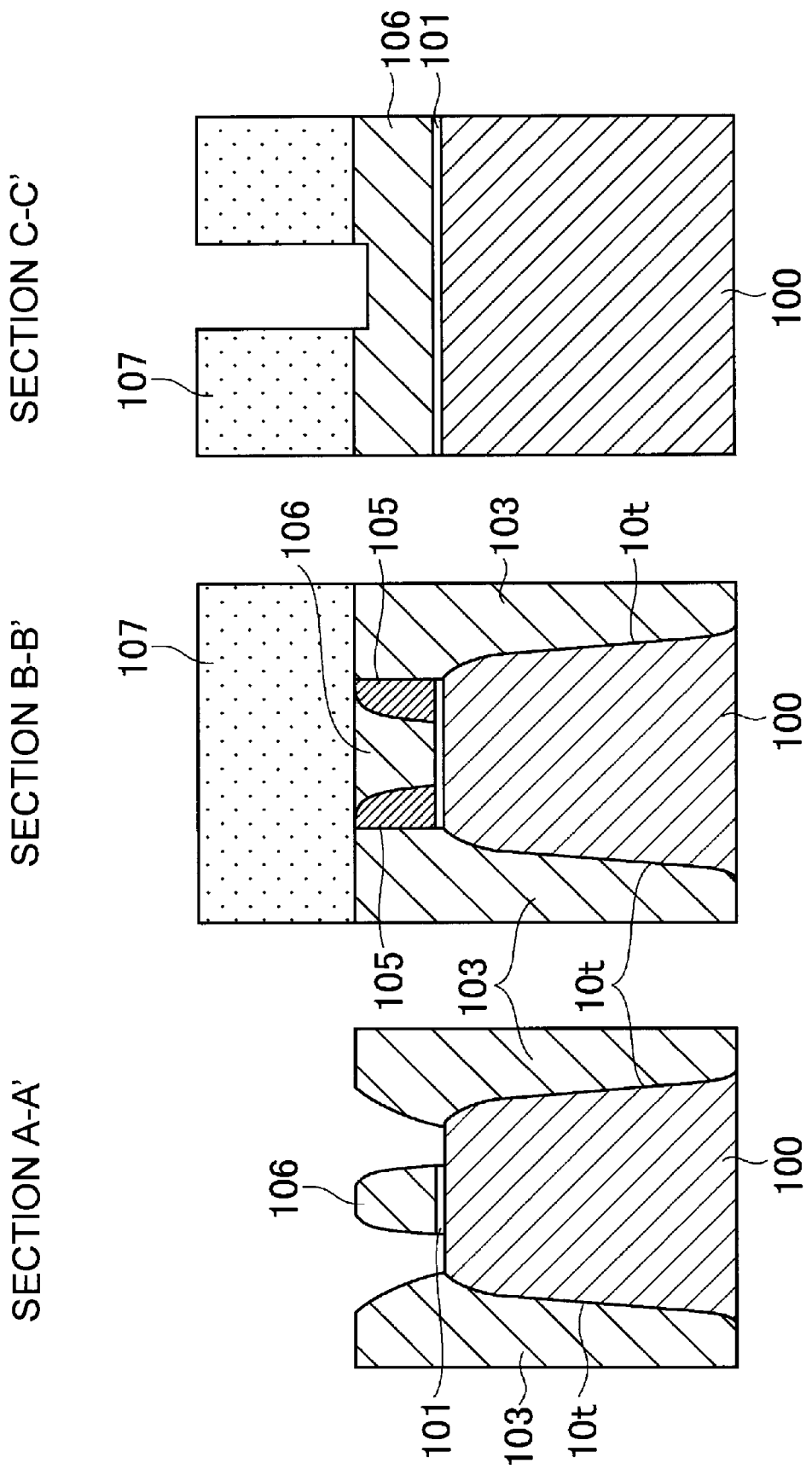
FIG. 9 is a cross-sectional view showing one process (selectively etching of the silicon nitride film 105) in the method of manufacturing the semiconductor device according to the embodiment of the present invention.

As shown in FIG. 9, a photoresist including openings for exposing regions in which the gate electrodes 12 are to be formed (see FIG. 1B) (that is, a photoresist patterned to open the regions in which the gate electrodes 12 are to be formed) 107 is formed, and the silicon nitride film 105 is selectively removed by dry etching. At this time, surfaces of the silicon oxide films 103 and 106 are also etched. Particularly in the section A-A', as shown in the drawings, corners of the silicon oxide films 106 and 103 are chipped because the corners are etched more easily.

After removing the photoresist 107, etching for silicon oxide films is performed so as to remove the pad oxide film 101 exposed between the silicon oxide films 103 and 106.

Figure 10:
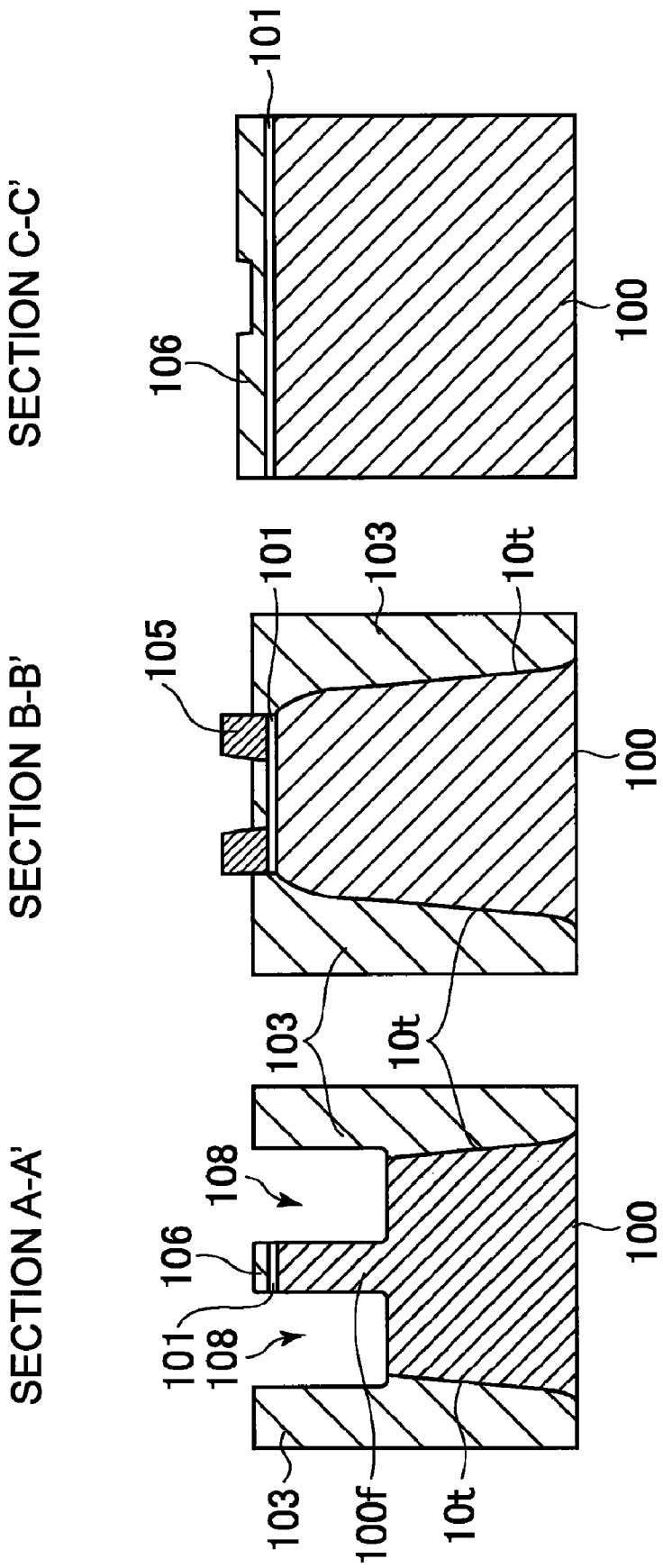
FIG. 10 is a cross-sectional view showing one process (formation of gate trenches 108) in the method of manufacturing the semiconductor device according to the embodiment of the present invention.

As shown in FIG. 10, while using the silicon oxide films 103 and 106 as a mask, gate trenches 108 each having a depth of about 100 nm are formed in the semiconductor substrate 100 by isotropic etching. At this time, an etch rate of etching the semiconductor substrate 100 is preferably about 1.5 times as fast as that of etching the oxide films 103 and 106. By so setting, the silicon oxide films 103 and 106 are also etched.

In this manner, the two trenches 108 and a fin-shaped part 100f that is a part of the semiconductor substrate 100 held between the two gate trenches 108 are formed on the semiconductor substrate 100.

Figure 11:
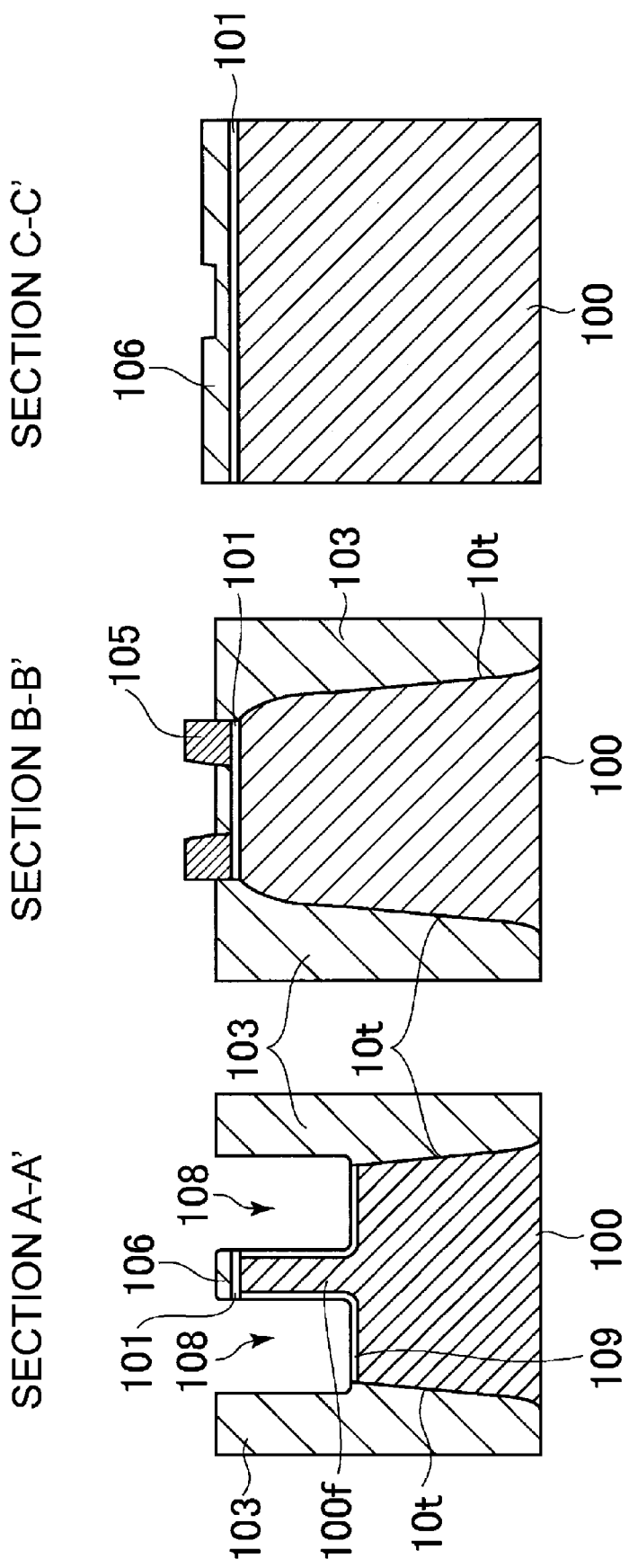
FIG. 11 is a cross-sectional view showing one process (formation of a sacrificial oxide film 109) in the method of manufacturing the semiconductor device according to the embodiment of the present invention.

As shown in FIG. 11, sacrificial oxidation is performed to form a sacrificial oxide film 109.

Thereafter, the silicon nitride film 105 is removed by wet etching and then the silicon oxide films 103 and 106 are wet-etched, thereby removing the surfaces of the silicon oxide films 103 and 106, the pad oxide film 101, and the sacrificial oxide film 109.

Figure 12:
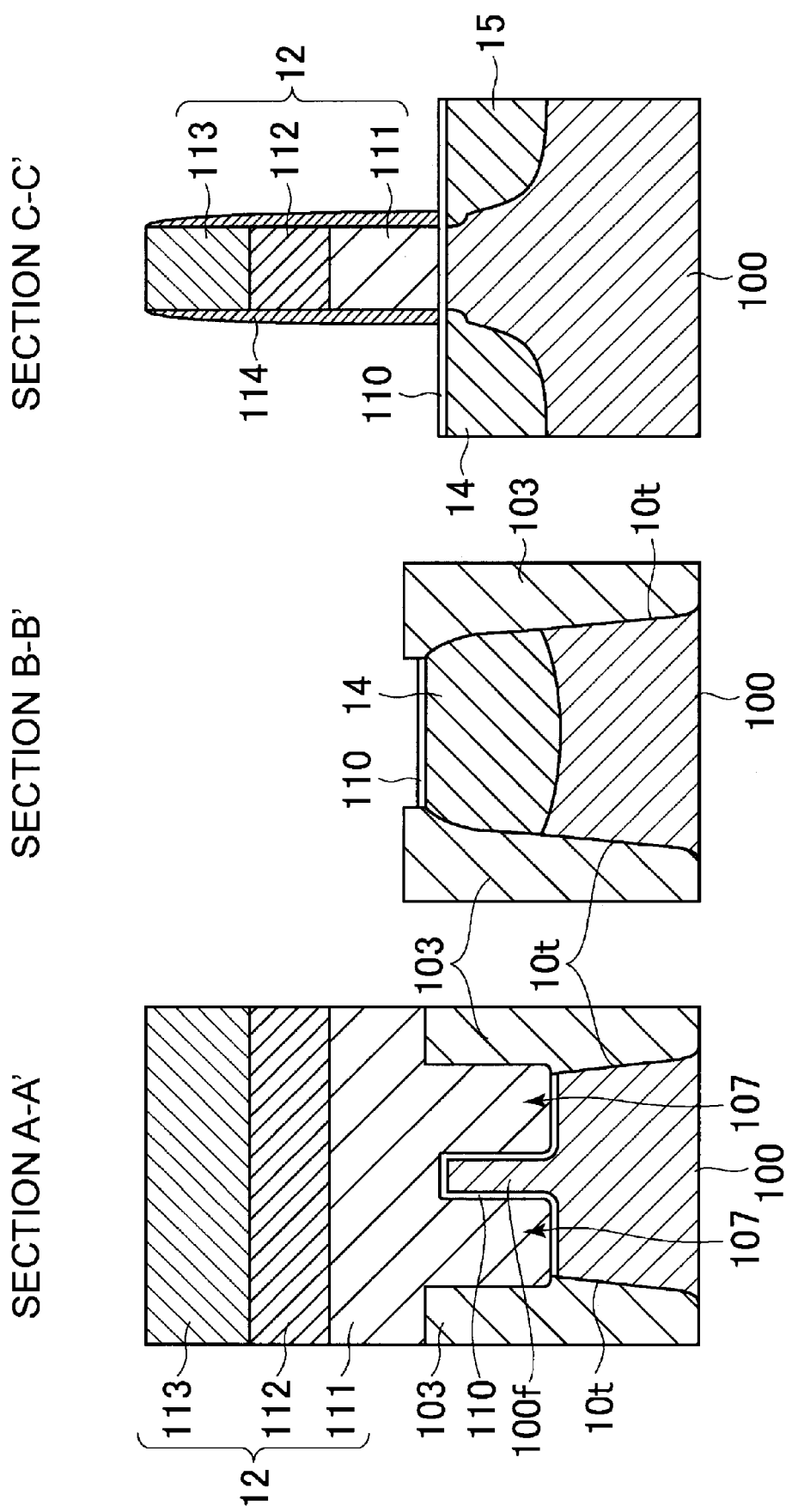
FIG. 12 is a cross-sectional view showing one process (formation of a gate oxide film 110, formation of a gate electrode 12 and formation of a source region 14 and drain region 15) in the method of manufacturing the semiconductor device according to the embodiment of the present invention.

As shown in FIG. 12, a silicon oxide film (gate oxide film) 110 having a thickness of about 6 nm is formed as a gate insulating film. The gate oxide film 110 is formed to cover up both side surfaces and an upper surface of the fin-shaped part 100f of the semiconductor substrate 100.

Next, a doped polysilicon (DOPOS) film 111 having a thickness of about 100 nm is formed on the entire surface including interiors of the two gate trenches 108. A W/WN/WSi film 112 including a stack of a tungsten silicide (WSi) film, a tungsten nitride (WN) film, and a tungsten (W) film and a having a thickness of about 70 nm, and a silicon nitride film 113 having a thickness of about 140 nm are formed on the DOPOS film 111 in this order. Thereafter, multilayer films of the DOPOS film 111, the W/WN/WSi film 112, and the silicon nitride film 113 are patterned. As a result, the gate electrodes 12 each having a part of an electrode material buried in the gate trenches 108 are completed.

Next, while the gate electrodes 12 are used as a mask, impurity ions are implanted into the semiconductor substrate 100 to form an LDD (Lightly Doped Drain) layer. Thereafter, sidewall insulating films 114 each having a thickness of 25 nm to 35 nm is formed on respective side surfaces of the gate electrodes 12.

While using the gate electrodes 12 and the sidewall insulating films 114 as a mask, impurity ions are implanted into the semiconductor substrate 100, thereby forming the source and drain regions 14 and 15.

Figure 13:
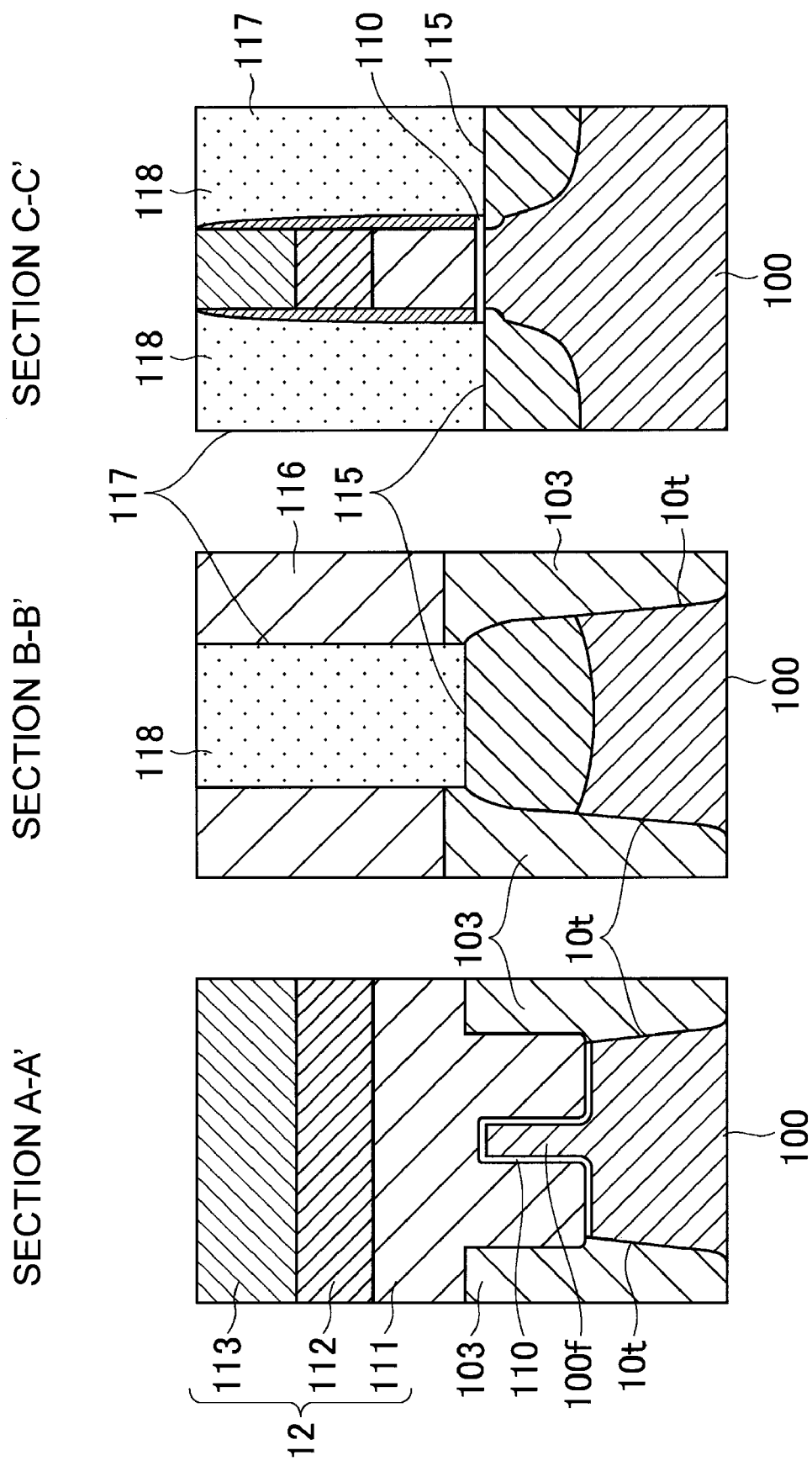
FIG. 13 is a cross-sectional view showing one process (selectively removing of the silicon oxide film 110 and formation of contact plugs 118) in the method of manufacturing the semiconductor device according to the embodiment of the present invention.
Figure 14A:
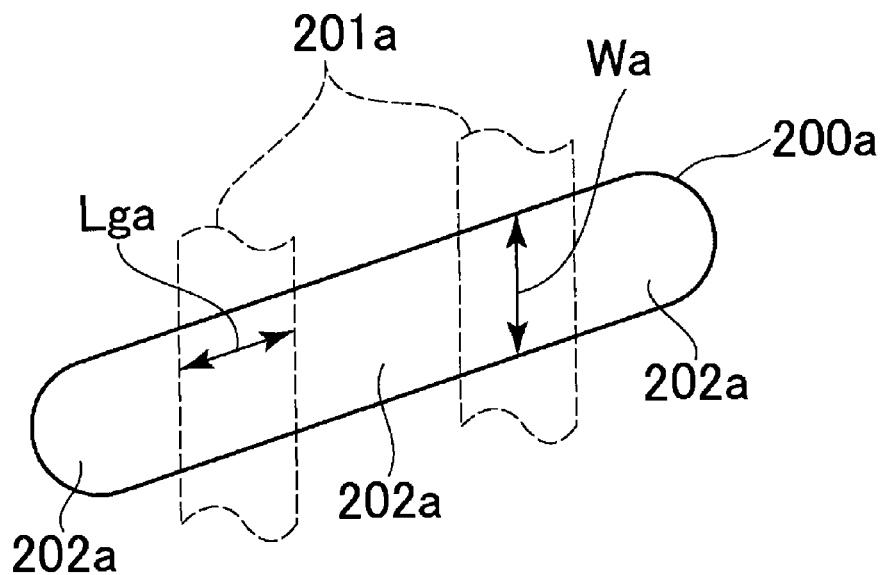
FIG. 14A is a generally plan view of a conventional fin-FET.
Figure 14B:
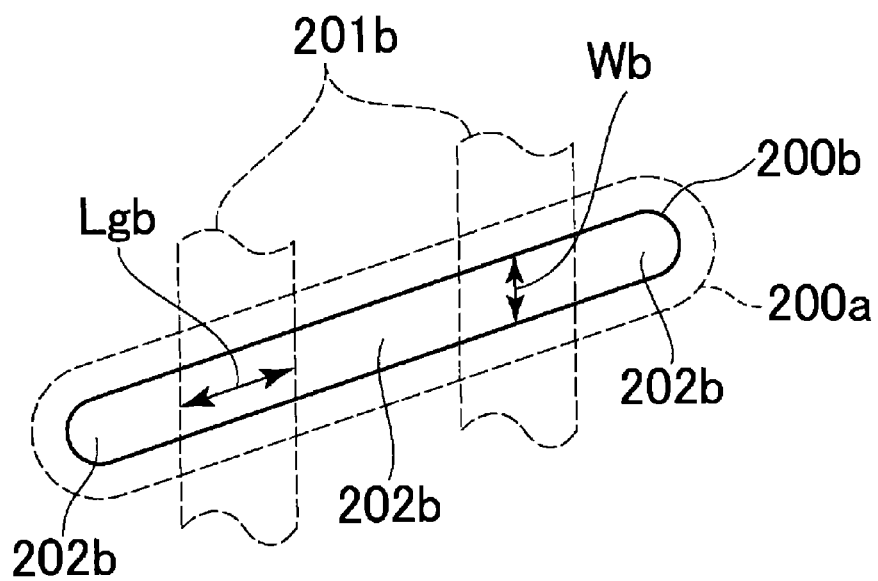
FIG. 14B is a generally plan view of a fin-FET according to a related art.

Thereafter, as shown in FIG. 13, after the gate oxide film 110 on the source and drain regions 14 and 15 is removed to expose contact regions 115, an interlayer insulating film 116 is formed. Next, contact holes 117 are opened in the interlayer insulating film 116, and contact plugs 118 are formed in the respective contact holes 117.

Thereafter, although not shown in the drawings, memory cell capacitors, wirings and the like are formed by ordinary method, thus completing the DRAM.

As described above, according to the embodiment of the present invention, the width of each channel region is made smaller than the gate length in the fin field effect transistor, whereby the short channel effect can be suppressed. Furthermore, magnitudes of the contact regions (source and drain regions) do not depend on the width of each channel region. It is, therefore, possible to secure necessary areas for the contact regions (source and drain regions) and prevent reduction in the ON-current.

The present invention can preferably apply to the semiconductor memory device, especially a DRAM.

Figure 15:
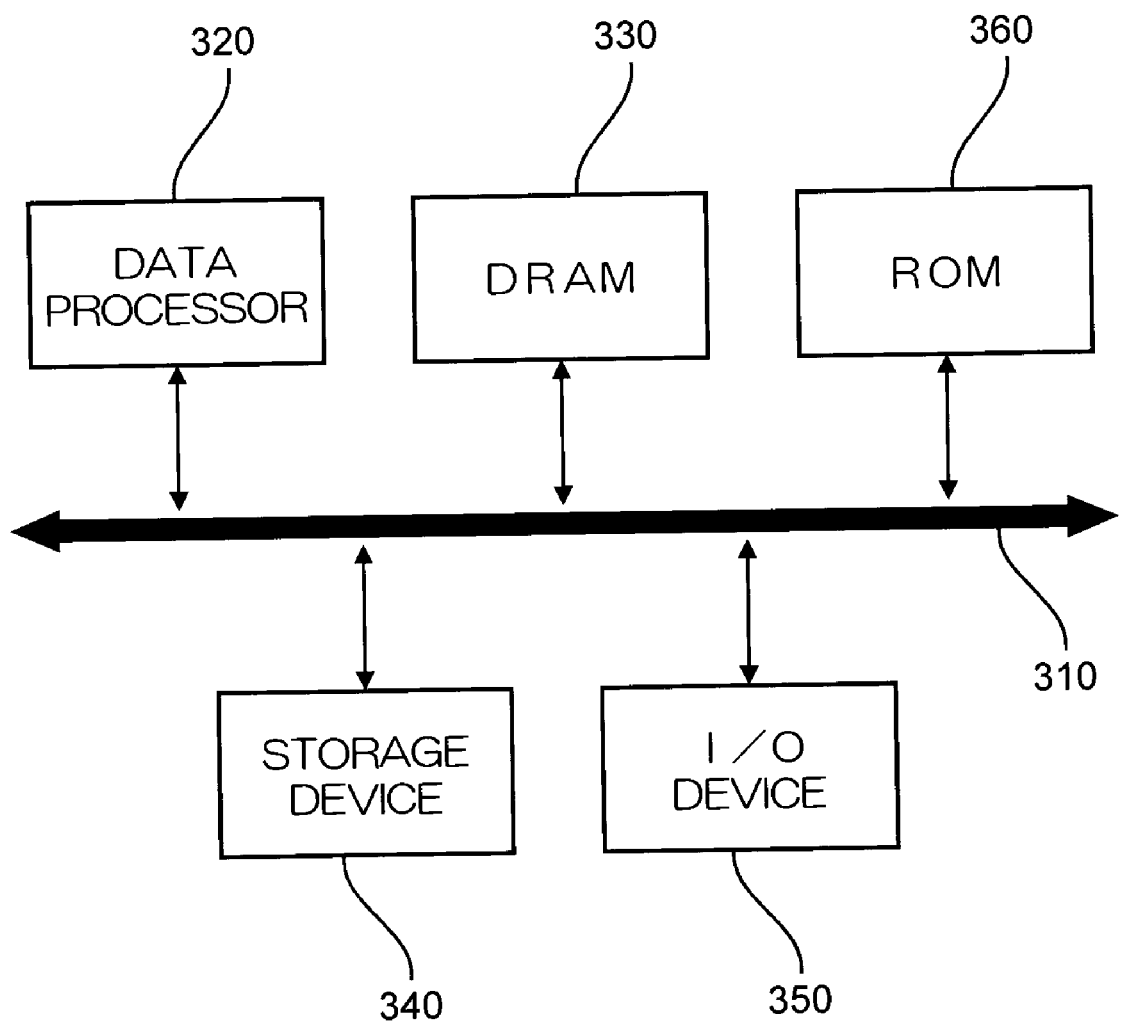
FIG. 15 is a block diagram showing a data processing system using the DRAM that the present invention is applied.

FIG. 15 is a block diagram showing a data processing system using the DRAM that the present invention is applied.

The data processing system 300 shown in FIG. 15 includes a data processor 320 and a DRAM 330 that the present invention is applied are connected to each other via a system bus 310. The data processor 320 can be selected from at least a microprocessor (MPU) and a digital signal processor (DSP). In FIG. 15, although the data processor 320 and the DRAM 330 are connected via the system bus 310 in order to simplify the diagram, they can be connected via not the system bus 310 but a local bus.

Further, in FIG. 15, although only one set of system bus 310 is employed in the data processing system 300 in order to simplify the diagram, a serial bus or a parallel bus connected to the system bus 310 via connectors can be provided. As shown in FIG. 15, a storage device 340, an I/O device 350, and a ROM 360 are connected to the system bus 310. However, they are not essential element for the data processing system 300.

The storage device 340 can be selected from at least a hard disk drive, an optical disk drive, and flash memory device. The I/O device 350 can be selected from a display device such as a liquid crystal display (LCD) and an input device such as a key board or a mouse. The I/O device 350 can consists of either input or output device. Further, although each one element is provided as shown in FIG. 15, two or more same elements can be provided in the data processing system.

While a preferred embodiment of the present invention has been described hereinbefore, the present invention is not limited to the aforementioned embodiment and various modifications can be made without departing from the spirit of the present invention. It goes without saying that such modifications are included in the scope of the present invention.

For example, while the example of applying the present invention to the memory cell transistor in the DRAM has been described in the embodiment, the present invention is not limited to the memory but is applicable to logic-related devices.

What is claimed is:

1. A method of manufacturing a semiconductor substrate comprising steps of:
   forming a mask layer on a semiconductor substrate, the mask layer covering up a region to serve as an active region and including an opening for exposing a region to serve as an STI region;
   forming a trench for the STI region using the mask layer;
   forming a first insulating film in the trench and in the opening of the mask layer without removing the mask layer;
   forming a second opening corresponding to the mask layer in the first insulating film by selectively removing the mask layer;
   forming a sidewall insulating film on an inner wall of the second opening;
   forming a second insulating film in the second opening in which the sidewall insulating film is formed;
   selectively removing the sidewall insulating film in a region in which a gate electrode is to be formed;
   forming two trenches in the region in which the gate electrode is to be formed on the semiconductor substrate using the first insulating film and the second insulating film as a mask, and forming a fin-shaped part which is located between the two gate trenches, which is a part of the semiconductor substrate, and which is to serve as a channel region;
   forming a gate insulating film at least on an upper surface and a side surface of the fin-shaped part; and
   forming the gate electrode buried in the two gate trenches and covering up the fin-shaped part.

2. The method of manufacturing the semiconductor device as claimed in claim 1, wherein a width of the channel region is smaller than a gate length.

3. The method of manufacturing the semiconductor device as claimed in claim 1, further comprising:
   forming a source region and a drain region by implanting impurity ions into the semiconductor substrate using the gate electrode as a mask; and
   selectively removing the gate insulating film formed on surfaces of the source region and the drain region, thereby forming contact regions on the surfaces of the source region and the drain region, respectively.

4. The method of manufacturing the semiconductor device as claimed in claim 2, further comprising:
   forming a source region and a drain region by implanting impurity ions into the semiconductor substrate using the gate electrode as a mask; and
   selectively removing the gate insulating film formed on surfaces of the source region and the drain region, thereby forming contact regions on the surfaces of the source region and the drain region, respectively.

5. The method of manufacturing the semiconductor device as claimed in claim 3, wherein a width of the contact region in one direction to cross the active region is larger than a width of the channel region.

6. The method of manufacturing the semiconductor device as claimed in claim 4, wherein a width of the contact region in one direction to cross the active region is larger than a width of the channel region.

7. The method of manufacturing the semiconductor device as claimed in claim 1, wherein the gate insulating film is formed on both side surfaces of the fin-shaped part.

8. The method of manufacturing the semiconductor device as claimed in claim 2, wherein the gate insulating film is formed on both side surfaces of the fin-shaped part.

9. The method of manufacturing the semiconductor device as claimed in claim 3, wherein the gate insulating film is formed on both side surfaces of the fin-shaped part.

10. The method of manufacturing the semiconductor device as claimed in claim 4, wherein the gate insulating film is formed on both side surfaces of the fin-shaped part.

* * * * *